(12) United States Patent
Yamamoto et al.

(10) Patent No.: US 6,984,413 B2
(45) Date of Patent: Jan. 10, 2006

(54) REMOVABLE PRESSURE-SENSITIVE ADHESIVE SHEET

(75) Inventors: Takayuki Yamamoto, Osaka (JP); Tomohiro Taruno, Osaka (JP); Keisuke Watanabe, Osaka (JP); Takeshi Matsumura, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/735,892

(22) Filed: Dec. 14, 2000

(65) Prior Publication Data

US 2003/0012949 A1 Jan. 16, 2003

(30) Foreign Application Priority Data

Dec. 14, 1999 (JP) ............................. P. 11-355190
Aug. 30, 2000 (JP) ......................... P.2000-261963

(51) Int. Cl.
*C09J 7/02* (2006.01)

(52) U.S. Cl. .............................. 427/208.4; 428/355 R; 428/355 AC; 428/345; 526/89; 526/329.7; 156/331.8

(58) Field of Classification Search ............ 526/329.7, 526/89; 428/355 R, 355 AC, 345; 156/331.8; 427/208.4

See application file for complete search history.

(56) References Cited

U.S. PATENT DOCUMENTS

| 4,288,479 | A |   | 9/1981 | Brack |
|---|---|---|---|---|
| 5,187,007 | A |   | 2/1993 | Ebe et al. |
| 5,597,648 | A | * | 1/1997 | Hanneman et al. ........ 428/40.7 |
| 5,688,573 | A |   | 11/1997 | Goeb et al. |
| 5,716,685 | A |   | 2/1998 | Kumar et al. |
| 5,824,726 | A | * | 10/1998 | DeSimone et al. ......... 524/424 |
| 6,376,633 | B1 | * | 4/2002 | Yamamoto et al. ...... 526/329.7 |

FOREIGN PATENT DOCUMENTS

| CN | 1 228 441 A |   | 9/1999 |
|---|---|---|---|
| EP | 818 470 A1 | * | 1/1998 |
| EP | 1 016 680 A1 |   | 7/2000 |
| EP | 1 061 108 A2 |   | 12/2000 |
| JP | 8-330257 |   | 12/1996 |
| JP | 9-7981 |   | 1/1997 |
| JP | 9-36069 |   | 2/1997 |
| JP | 9-71757 |   | 3/1997 |
| JP | 9-272846 |   | 10/1997 |
| WO | WO 94/20583 A1 |   | 9/1994 |
| WO | WO 99/50902 A1 |   | 7/1999 |
| WO | WO 99/50902 A1 |   | 10/1999 |

OTHER PUBLICATIONS

U.S. Appl. No. 09/472,870, cited on applicants Proprietary IDS, which later became US Pat. 6,376,633, filed Dec. 28, 1999.*
Organic Coatings : Science and Technology, vol. 1 Chapter IV, pp. 49-53, 1992.*
Patent Abstracts of Japan—11-255812 (Sep. 21, 1999).
Australian Patent Office Search Report dated Aug. 1, 2002.
Patent Abstracts of Japan—JP 10 279894 (1998).
European Search Report dated May 26, 2003.

* cited by examiner

*Primary Examiner*—Daniel Zirker
(74) *Attorney, Agent, or Firm*—Sughrue Mion, PLLC

(57) ABSTRACT

A removable pressure-sensitive adhesive sheet is disclosed which, when used for fixing adherends thereto in work processing or the like, has such a degree of tackiness as not to peel off the adherends and which, after the work processing or the like, can be easily removed from the adherends without fouling them. The removable pressure-sensitive adhesive sheet comprises a pressure-sensitive adhesive layer constituted of a pressure-sensitive adhesive comprising a polymer in which the content of low-molecular components having a molecular weight of $10^5$ or lower is 10% by weight or lower. The polymer constituting the pressure-sensitive adhesive may be an acrylic polymer obtained by polymerizing one or more monomers in liquid or supercritical carbon dioxide. The removable pressure-sensitive adhesive sheet can be used, e.g., as a pressure-sensitive adhesive sheet for semiconductor wafer processing.

1 Claim, No Drawings

REMOVABLE PRESSURE-SENSITIVE ADHESIVE SHEET

FIELD OF THE INVENTION

The present invention relates to a removable pressure-sensitive adhesive sheet reduced in fouling which is suitable for use in the production of finely processed parts such as various industrial members, e.g., semiconductors, circuits, various printed wiring boards, various masks, and lead frames.

DESCRIPTION OF THE RELATED ART

A semiconductor integrated circuit is usually produced by slicing a high-purity silicon single crystal or the like to obtain a wafer, forming given circuit patterns such as integrated circuits on a surface of the wafer by etching, subsequently grinding the back side of this wafer with a grinder to reduce the thickness of the wafer to about 100 to 600 $\mu$m, and finally dicing the wafer to form chips. In conducting the grinding, a pressure-sensitive adhesive sheet is applied to the front side of the wafer so as to prevent wafer breakage or facilitate the grinding. In conducting the dicing, a pressure-sensitive adhesive sheet is applied to the back side of the wafer to dice the wafer adhesively fixed to the sheet. After the dicing, the chips formed are pushed up with needles from the film substrate side, subsequently picked up, and then fixed to die pads.

Pressure-sensitive adhesive sheets for use for these purposes are required to have such a degree of tackiness as not to peel off during grinding or dicing. These pressure-sensitive adhesive sheets are simultaneously required to have such a low degree of tackiness as to be capable of being easily peeled from the semiconductor wafers without breaking them when the wafers are picked up after the grinding or dicing. In addition, the pressure-sensitive adhesive sheets are desired to leave no adhesive residue on the front or back side of the wafers so as not to foul the surfaces of the wafers.

Recently, there is a trend toward diameter increase and thickness reduction in semiconductor wafers, and the step of etching the wafer back side with an acid is coming to be additionally conducted. Under these circumstances, it has become difficult for those pressure-sensitive adhesive sheets to retain a balance among various properties including water resistance during processing, the property of not causing wafer breakage during processing or upon sheet removal, acid resistance during acid etching, removability, and non-fouling properties. Furthermore, in view of the recent situation in which semiconductor packages of the LOC structure and semiconductor packages having a structure in which the area of the die pad is smaller than the chip are coming to be increasingly used, it has become more important for the pressure-sensitive adhesive sheets to be reduced in wafer back side fouling in the dicing step so as not to impair the adhesion of the back side of the semiconductor wafer to the package, because in those packages the back side of the chip is in direct contact with the encapsulating resin as different from conventional packages.

The pressure-sensitive adhesive sheets for use in semiconductor wafer processing which are most attracting attention recently are pressure-sensitive adhesive sheets of the radiation-curable type, i.e., pressure-sensitive adhesive sheets comprising a film substrate and a radiation-curable pressure-sensitive adhesive layer formed on one side thereof. Since this kind of pressure-sensitive adhesive sheet in its ordinary state has high tackiness, application thereof to the back or front side of a wafer gives high tackiness which enables the pressure-sensitive adhesive sheet to withstand the water pressure used for grinding or dicing. Satisfactory acid resistance also can be expected, for example, when the pressure-sensitive adhesive has a suitably selected composition. After the processing, the pressure-sensitive adhesive sheet is irradiated with a radiation, e.g., light, to cure the pressure-sensitive adhesive layer, whereby the tackiness of the pressure-sensitive adhesive layer significantly decreases. As a result, satisfactory removability and the property of not causing wafer breakage are obtained. This type of pressure-sensitive adhesive sheet further has an advantage that the curing is effective also in obtaining relatively satisfactory results concerning wafer-nonfouling properties.

However, the radiation-curable pressure-sensitive adhesive sheet has a drawback that it emits a strong odor upon curing by light irradiation and this odor not only makes the worker unpleasant but is by no means desirable from the standpoint of health and hygiene. Although this pressure-sensitive adhesive sheet is far superior to other pressure-sensitive adhesive sheets in wafer-nonfouling properties after removal, there still are cases where the pressure-sensitive adhesive sheet leaves an adhesive residue on the order of micron or submicron. In case where fouling is on the back side of a wafer which has undergone dicing, it is causative of undesirable separation between the chip back side and an encapsulating resin when a semiconductor package is subjected to reflow soldering. Namely, there has been a problem that the long-term reliability of semiconductor integrated circuits is impaired.

SUMMARY OF THE INVENTION

The invention has been achieved in view of these circumstances.

Accordingly, an object of the invention is to provide a removable pressure-sensitive adhesive sheet which, when used for fixing adherends thereto in work processing or the like, has such a degree of tackiness as not to peel off the adherends and which, after the work processing or the like, can be easily removed from the adherends without fouling them. In particular, the object is to provide a removable pressure-sensitive adhesive sheet which, when used as, e.g., a radiation-curable pressure-sensitive adhesive sheet for semiconductor wafer processing, has high tackiness during processing such as grinding or dicing to facilitate the processing and, after the processing, can be made easily removable, through curing by irradiation with a radiation, without causing wafer breakage, etc. Furthermore, this pressure-sensitive adhesive sheet neither emits a strong odor upon curing nor leaves a fouling adhesive residue on the order of micron or submicron. In particular, there is no possibility that the chip back side/encapsulating resin separation attributable to such wafer back side fouling might occur.

As a result of intensive investigations to achieve the object, it has been found that when a pressure-sensitive adhesive sheet which has a pressure-sensitive adhesive layer comprising a base polymer having a low content of low-molecular polymeric components having a molecular weight of 100,000 or lower is used, then the pressure-sensitive adhesive layer does not cause organic fouling of articles. Namely, it has been found that this pressure-sensitive adhesive sheet, when used for semiconductor wafer processing, is highly effective in inhibiting the chip/encapsulating resin separation attributable to such organic fouling. The invention has been completed based on this finding.

The invention provides a removable pressure-sensitive adhesive sheet which comprises a pressure-sensitive adhesive layer comprising a polymer in which the content of low-molecular components having a molecular weight of $10^5$ or lower is 10% by weight or lower.

The polymer constituting the pressure-sensitive adhesive may be an acrylic polymer obtained by polymerizing one or more monomers in liquid or supercritical carbon dioxide. The polymer constituting the pressure-sensitive adhesive may also be an acrylic polymer obtained by polymerizing one or more monomers in an aqueous dispersion system, or may be an acrylic polymer obtained by solution-polymerizing one or more monomers in an organic solvent such as, e.g., toluene. The removable pressure-sensitive adhesive sheet can be used as a pressure-sensitive adhesive sheet for semiconductor wafer processing.

DETAILED DESCRIPTION OF THE INVENTION

The pressure-sensitive adhesive that can be used for constituting the pressure-sensitive adhesive layer of the removable pressure-sensitive adhesive sheet of the invention can be any conventional pressure-sensitive adhesives for use in pressure-sensitive adhesive sheets. Of those, acrylic pressure-sensitive adhesives comprising an acrylic polymer as the base polymer (basic component of the pressure-sensitive adhesive) are preferable.

Examples of monomers used as raw materials for the acrylic polymer include alkyl (meth)acrylates such as $C_{1-18}$ alkyl esters of (meth)acrylic acid, e.g., methyl acrylate, ethyl acrylate, propyl acrylate, butyl acrylate, 2-ethylhexyl acrylate, octyl acrylate, butyl methacrylate, 2-ethylhexyl methacrylate, and octyl methacrylate. These alkyl (meth)acrylates can be used alone or in combination of two or more thereof. It is also possible to use one or more of these alkyl (meth)acrylates as the main monomer in combination with one or more other monomers copolymerizable therewith.

Typical examples of the copolymerizable monomers include carboxyl-containing ethylenically unsaturated monomers such as (meth)acrylic acid, crotonic acid, itaconic acid, maleic acid, and fumaric acid. An especially preferred monomer among those is acrylic acid. Such carboxyl-containing ethylenically unsaturated monomers are necessary ingredients for enabling the polymer to have crosslinks.

Also, the copolymerizable monomers that can further be used are any of various monomers known as modifying monomers for acrylic pressure-sensitive adhesives. Examples of the modifying monomers include vinyl esters such as vinyl acetate, styrene type monomers such as styrene, cyano-containing monomers such as acrylonitrile, and (meth)acrylamide and cyclic or noncyclic derivatives thereof.

The amount of these copolymerizable monomers is preferably up to 50% by weight based on the total amount of all monomer ingredients including the main monomer, from the standpoint of adhesive performance.

A polymerization reaction can be conducted with the aid of an initiator which decomposes to generate a free radical. Any of the initiations for use in radical polymerization can be used. Especially in the case where polymerization is conducted at a temperature of from 40 to 100° C., various organic peroxides and azo compounds can be used as such initiators. Examples thereof include organic peroxides such as dibenzoyl peroxide, di-tert-butyl peroxide, cumene hydroperoxide, and lauryl peroxide and azo compounds such as 2,2'-azobisisobutyronitrile and azobisisovaleronitrile. In the case where polymerization is conducted at a temperature of from 20 to 40° C., a binary initiator (redox initiator) may be used. Examples thereof include a binary system composed of dibenzoyl peroxide and dimethylaniline.

The initiator may be used in an amount ordinarily used in the polymerization of the acrylic monomers shown above. For example, the amount thereof is generally about 0.005 to 10 parts by weight, preferably about 0.1 to 5 parts by weight, per 100 parts by weight of the monomers.

An important feature of the invention resides in that a polymer in which the content of low-molecular components having a molecular weight of 100,000 or lower is 10% by weight or lower is used as the base polymer constituting the pressure-sensitive adhesive. Such a polymer can be obtained, for example, by polymerizing monomers in liquid or supercritical carbon dioxide as a diluent. The content of the low-molecular components in a polymer can be determined by gel permeation chromatography (GPC).

The carbon dioxide as a diluent may be used in an amount of, for example, 5 to 2,000 parts by weight, preferably about 20 to 900 parts by weight, per 100 parts by weight of all monomer ingredients. The polymerization is conducted in carbon dioxide regulated so as to have a pressure of, e.g., about 5.73 to 40 MPa, at a temperature of, e.g., about 20 to 100° C. for usually about 10 hours. The pressure and temperature for the polymerization may be stepwise changed according to need.

The use of carbon dioxide as a diluent not only is effective in keeping the system at a low viscosity throughout the polymerization due to its diluting effect to improve the efficiency of stirring, but also inhibits radical chain transfer. Because of this, a high-molecular polymer is obtained which has a lower content of low-molecular components than conventional polymers synthesized with organic solvents. Consequently, by using such a polymer as an adhesive base polymer, a pressure-sensitive adhesive can be obtained which is excellent in both cohesive force and adhesive strength and is reduced in the fouling of adherends.

Although carbon dioxide alone is usually sufficient as a diluent, it may contain a small amount of an organic solvent for the purpose of miscibility improvement, etc. according to need.

The polymer in which the content of low-molecular components having a molecular weight of 100,000 or lower is 10% by weight or lower can be obtained also through the solution polymerization of one or more monomers in an organic solvent, e.g., toluene or ethyl acetate, as a diluent when the polymerization conditions including the kind and amount of an initiator, polymerization temperature, and polymerization period are suitably selected according to the kinds of the monomers. This solution polymerization can be carried out, for example, in a reactor equipped with a condenser, nitrogen feed pipe, thermometer, stirrer, etc. The organic solvent is used in an amount of, for example, 5 to 2,000 parts by weight, preferably about 20 to 900 parts by weight, per 100 parts by weight of all monomer ingredients.

The polymer in which the content of low-molecular components having a molecular weight of 100,000 or lower is 10% by weight or lower can be obtained also by emulsion-polymerizing one or more monomers in an aqueous dispersion system. Methods for this polymerization are not particularly limited, and any desired emulsion polymerization technique can be employed according to the intended use. For example, a method may be used in which a monomer mixture is emulsified in water and this emulsion is charged into a reactor en bloc to polymerize the monomers. A technique is also used in which the aqueous monomer emulsion is fed dropwise. Although emulsifying agents for use in this emulsion polymerization are not particularly limited, it is preferred to use nonionic surfactants and/or anionic surfactants. Emulsifying agents can be used alone or in combination of two or more thereof.

Examples of the nonionic surfactants include polyoxyethylene alkyl ethers, polyoxyethylene alkylphenyl ethers, polyoxyethylene/polyoxypropylene block copolymers, sorbitan/fatty acid esters, and polyoxyethylene/fatty acid esters. On the other hand, examples of the anionic surfactants include alkylsulfuric acid esters, alkylbenzenesulfonic acid salts, alkylsulfosuccinic acid salts, polyoxyethylene alkylsulfuric acid salts, and polyoxyethylene alkylphosphoric acid esters. The amount of an emulsifying agent to be used can be suitably selected according to the desired particle diameter, etc. However, for example, in the case where a nonionic surfactant or anionic surfactant is used alone, the amount thereof is generally about 0.3 to 30 parts by weight per 100 parts by weight of all monomer ingredients. In the case where a nonionic surfactant and an anionic surfactant are used in combination, the amounts of the former and the latter are about 0.2 to 20 parts by weight and about 0.1 to 10 parts by weight, respectively, per 100 parts by weight of all monomer ingredients.

The polymer synthesized by the method described above can be used as it is as the base polymer of a pressure-sensitive adhesive. However, a crosslinking agent is usually incorporated into the polymer for the purpose of improving the cohesive force of the pressure-sensitive adhesive. A crosslinked acrylic pressure-sensitive adhesive can be obtained by adding a polyfunctional (meth)acrylate or the like as an internal crosslinking agent during the synthesis of an acrylic polymer or by adding a polyfunctional epoxy compound or isocyanate compound or the like as an external crosslinking agent after the synthesis of an acrylic polymer. Besides these techniques, a crosslinking treatment with irradiation with a radiation may be conducted. Preferred of these techniques for forming a crosslinked structure is to incorporate a polyfunctional epoxy compound or polyfunctional isocyanate compound as an external crosslinking agent. The term "polyfunctional" as used herein means "to have two or more functional groups".

Examples of the polyfunctional epoxy compound include various compounds having two or more epoxy groups in the molecule. Typical examples thereof include sorbitol tetraglycidyl ether, trimethylolpropane glycidyl ether, tetraglycidyl-1,3-bisaminomethylcyclohexane, tetraglycidy-m-xylenediamine, and triglycidyl-p-aminophenol. Examples of the polyfunctional isocyanate compound include various compounds having two or more isocyanate groups in the molecule. Typical examples thereof include diphenylmethane diisocyanate, tolylene diisocyanate, and hexamethylene diisocyanate.

These crosslinking agents can be used alone or in combination of two or more thereof. The crosslinking agents may be used in an amount suitably selected according to the composition and molecular weight of the acrylic copolymer, etc. A crosslinking catalyst for ordinary use in pressure-sensitive adhesives, such as dibutyltin laurate, may be added together with a crosslinking agent in order to accelerate the reaction. Conventional additives may be incorporated into the pressure-sensitive adhesive according to need.

The constitution of the removable pressure-sensitive adhesive sheet of the invention is not particularly limited as long as it comprises a pressure-sensitive adhesive layer comprising the pressure-sensitive adhesive described above. It may be either a pressure-sensitive adhesive sheet comprising a substrate and the pressure-sensitive adhesive layer formed on at least one side thereof or a pressure-sensitive adhesive sheet consisting of the pressure-sensitive adhesive layer alone and having no substrate. For the purpose of protecting the pressure-sensitive adhesive layer, it is preferred to cover the pressure-sensitive adhesive layer with a release film until use. The form of the pressure-sensitive adhesive sheet of the invention is not particularly limited and may be an appropriate one such as a sheet or tape form.

The pressure-sensitive adhesive layer can have a thickness suitably selected according to use, etc. For example, the thickness thereof is 5 to 100 $\mu$m, preferably about 10 to 40 $\mu$m.

The substrate may be one for ordinary use in pressure-sensitive adhesive sheets. Examples thereof include films (or sheets) of plastics such as polyolefin resins, polyester resins, vinyl chloride resins, vinyl acetate resins, and polyimide resins; foam sheets; metal foils; nonwoven fabrics; and paper. These substrates may be used alone or in combination of two or more thereof. A substrate which has undergone a surface treatment such as corona treatment on one or both sides may also be used. The substrate can have a thickness suitably selected so as not to impair handle ability or other properties. However, the thickness thereof is generally about 50 to 300 $\mu$m, preferably about 70 to 200 $\mu$m.

A pressure-sensitive adhesive layer may be formed, for example, by discharging the pressurized polymer containing carbon dioxide into the air through the orifice of a die or the like to thereby form the polymer into a thin film. Alternatively, a technique may be used in which the polymerization system is returned to atmospheric pressure and the polymer is taken out, redissolved in an organic solvent such as toluene or ethyl acetate, and then formed into a thin film by a conventional coating technique using a roll coater or the like. In the case where a polymer is produced by solution polymerization or emulsion polymerization, a pressure-sensitive adhesive layer can be formed by applying the thus-obtained polymer solution or aqueous polymer dispersion to a substrate or the like by an ordinary technique. The pressure-sensitive adhesive layer thus formed on an adherend, substrate, release paper, or the like is subjected, according to need, to a drying step and a subsequent crosslinking treatment with irradiation with light, electron beams, etc., and then used.

The removable pressure-sensitive adhesive sheet of the invention is suitable for use as a pressure-sensitive adhesive sheet for work processing, such as a pressure-sensitive adhesive sheet for wafer back side grinding in semiconductor device production. However, uses of the removable pressure-sensitive adhesive sheet are not limited to this application, and it can be used in a wide range of applications including the production and processing of various articles or members in which a pressure-sensitive adhesive sheet is used in such a manner as to be peeled off during or after use. Examples of the applications thereof further include removal of foreign substances from various production apparatus, surface protection of members, and masking.

The invention will be explained below in more detail by reference to the following Examples, but the invention should not be construed as being limited to these Examples. Hereinafter, all parts and percents are by weight unless otherwise indicated.

REFERENCE EXAMPLE 1

Into a stainless-steel pressure vessel having a capacity of 500 ml were introduced 100 parts of n-butyl acrylate, 5 parts of acrylic acid, and 0.1 part of 2,2'-azobisisobutyronitrile at 25° C. in such respective amounts that the total amount thereof reached 200 g. While the contents were being stirred with stirring blades, high-purity carbon dioxide was gradually introduced into the vessel to hold the internal pressure at 2 MPa for several seconds. Thereafter, the carbon dioxide was discharged through a discharge opening to replace the air remaining in the pressure vessel with carbon dioxide. After this operation, high-purity carbon dioxide was introduced in the same manner at 25° C. and the internal pressure was held at 7 MPa for a while. The vessel was then heated to elevate the internal temperature to 60° C. At the time when the internal temperature had reached 60° C., high-purity carbon dioxide was further introduced to adjust the internal pressure at 20 MPa. The vessel was held in this state for about 12 hours to conduct polymerization. Thereafter, the internal pressure was returned to atmospheric pressure to obtain a polymer of Reference Example 1.

This polymer had a weight-average molecular weight as determined by gel permeation chromatography of 1,680,000. The content of components having a molecular weight of 100,000 or lower in this polymer was 2.9%.

REFERENCE EXAMPLE 2

Into a three-necked flask reactor having a capacity of 500 ml equipped with a thermometer, stirrer, nitrogen feed pipe, and reflux condenser were introduced 100 parts of n-butyl acrylate, 5 parts of acrylic acid, 0.1 part of 2,2'-azobisisobutyronitrile, and 200 parts of ethyl acetate in such respective amounts that the total amount thereof reached 200 g. The contents were stirred while introducing nitrogen gas for about 1 hour to replace the air present in the reactor with nitrogen. Thereafter, the internal temperature was adjusted to 60° C. and the reactor was held in this state for about 6 hours to conduct polymerization. Thus, a polymer solution of Reference Example 2 was obtained.

This polymer had a weight-average molecular weight as determined by gel permeation chromatography of 1,650,000. The content of components having a molecular weight of 100,000 or lower in this polymer was 13.1%.

REFERENCE EXAMPLE 3

Into a stainless-steel pressure vessel having a capacity of 500 ml were introduced 77 parts of 2-ethylhexyl acrylate, 20 parts of N-acryloylmorpholine, 3 parts of acrylic acid, and 0.2 parts of 2,2'-azobisisobutyronitrile at 25° C. in such respective amounts that the total amount thereof reached 200 g. While the contents were being stirred with stirring blades, high-purity carbon dioxide was gradually introduced into the vessel to hold the internal pressure at 2 MPa for several seconds. Thereafter, the carbon dioxide was discharged through a discharge opening to replace the air remaining in the pressure vessel with carbon dioxide. After this operation, high-purity carbon dioxide was introduced in the same manner at 25° C. and the internal pressure was held at 7 MPa for a while. The vessel was then heated to elevate the internal temperature to 60° C. At the time when the internal temperature had reached 60° C., high-purity carbon dioxide was further introduced to adjust the internal pressure at 20 MPa. The vessel was held in this state for about 12 hours to conduct polymerization. Thereafter, the internal pressure was returned to atmospheric pressure to obtain a polymer of Reference Example 3.

This polymer had a weight-average molecular weight as determined by gel permeation chromatography of 1,240,000. The content of components having a molecular weight of 100,000 or lower in this polymer was 9.52%.

REFERENCE EXAMPLE 4

Into a three-necked flask reactor having a capacity of 500 ml equipped with a thermometer, stirrer, nitrogen feed pipe, and reflux condenser were introduced 77 parts of 2-ethylhexyl acrylate, 20 parts of N-acryloylmorpholine, 3 parts of acrylic acid, 0.2 parts of 2,2'-azobisisobutyronitrile, and 200 parts of ethyl acetate in such respective amounts that the total amount thereof reached 200 g. The contents were stirred while introducing nitrogen gas for about 1 hour to replace the air present in the reactor with nitrogen. Thereafter, the internal temperature was adjusted to 60° C. and the reactor was held in this state for about 6 hours to conduct polymerization. Thus, a polymer solution of Reference Example 4 was obtained.

This polymer had a weight-average molecular weight as determined by gel permeation chromatography of 1,120,000. The content of components having a molecular weight of 100,000 or lower in this polymer was 18.39%.

REFERENCE EXAMPLE 5

Into a three-necked flask reactor having a capacity of 500 ml equipped with a thermometer, stirrer, nitrogen feed pipe, and reflux condenser were introduced 73 parts of 2-ethylhexyl acrylate, 10 parts of n-butyl acrylate, 15 parts of N,N-dimethylacrylamide, 5 parts of acrylic acid, 0.15 parts of 2,2'-azobisisobutyronitrile as a polymerization initiator, and 100 parts of ethyl acetate in such respective amounts that the total amount thereof reached 200 g. The contents were stirred while introducing nitrogen gas for about 1 hour to replace the air present in the reactor with nitrogen. Thereafter, the internal temperature was adjusted to 58° C. and the reactor was held in this state for about 4 hours to conduct polymerization. Thus, a polymer solution of Reference Example 5 was obtained.

This polymer had a weight-average molecular weight as determined by gel permeation chromatography of 930,000. The content of components having a molecular weight of 100,000 or lower in this polymer was 7.5%.

REFERENCE EXAMPLE 6

Into a reactor equipped with a condenser, nitrogen feed pipe, thermometer, and stirrer was introduced a monomer mixture consisting of 59 parts of butyl acrylate, 40 parts of butyl methacrylate, and 1 part of acrylic acid. Into the reactor were further introduced 0.02 parts of 2,2'-azobis(2-amidinopropionamidine) dihydrochoride as a polymerization initiator, 1.5 parts of polyoxyethylene nonylphenyl ether as an emulsifying agent, and 100 parts of water. After the contents were emulsified, emulsion polymerization was conducted to obtain an aqueous dispersion of Reference Example 6.

This polymer (sol) had a weight-average molecular weight as determined by gel permeation chromatography of 2,100,000. The content of components having a molecular weight of 100,000 or lower in this polymer was 8.9%.

EXAMPLE 1

In 80 g of ethyl acetate was dissolved 20 g of the polymer obtained in Reference Example 1. Thereto were added 0.2 g of a polyisocyanate compound and 0.4 g of a polyfunctional epoxy compound. This mixture was stirred until it became homogeneous. The resulting solution was applied to a film substrate consisting of a polyester film having a thickness of 50 μm. The coating was dried in a drying oven at 70° C. and then at 130° C. for 3 minutes each to form an adhesive layer having a thickness of 35 μm. Thus, a removable adhesive sheet was produced.

COMPARATIVE EXAMPLE 1

To 100 g of the polymer solution obtained in Reference Example 2 were added 0.33 g of a polyisocyanate compound and 0.66 g of a polyfunctional epoxy compound. This mixture was stirred until it became homogeneous. The resultant solution was applied to a film substrate consisting of a polyester film having a thickness of 50 μm. The coating was dried in a drying oven at 70° C. and then at 130° C. for 3 minutes each to form an adhesive layer having a thickness of 35 μm. Thus, a removable adhesive sheet was produced.

EXAMPLE 2

In 80 g of ethyl acetate was dissolved 20 g of the polymer obtained in Reference Example 3. Thereto were added 0.4 g of a polyisocyanate compound and 0.2 g of a polyfunctional epoxy compound. This mixture was stirred until it became homogeneous. The resulting solution was applied to a film substrate consisting of a polyester film having a thickness of 50 μm. The coating was dried in a drying oven at 70° C. and then at 130° C. for 3 minutes each to form an adhesive layer having a thickness of 35 μm. Thus, a removable adhesive sheet was produced.

COMPARATIVE EXAMPLE 2

To 100 g of the polymer solution obtained in Reference Example 4 were added 0.33 g of a polyisocyanate compound and 0.66 g of a polyfunctional epoxy compound. This mixture was stirred until it became homogeneous. The resulting solution was applied to a film substrate consisting of a polyester film having a thickness of 50 μm. The coating was dried in a drying oven at 70° C. and then at 130° C. for 3 minutes each to form an adhesive layer having a thickness of 35 μm. Thus, a removable adhesive sheet was produced.

EXAMPLE 3

To 100 g of the polymer solution obtained in Reference Example 5 were added 0.33 g of a polyisocyanate compound and 0.66 g of a polyfunctional epoxy compound. This mixture was stirred until it became homogeneous. The resulting solution was applied to a film substrate consisting of a polyester film having a thickness of 50 μm. The coating was dried in a drying oven at 70° C. and then at 130° C. for 3 minutes each to form an adhesive layer having a thickness of 35 μm. Thus, a removable adhesive sheet was produced.

EXAMPLE 4

To 100 g of the aqueous dispersion obtained in Reference Example 6 was added 3 g of a water-soluble crosslinking agent containing an oxazoline group. This mixture was stirred until it became homogeneous. The resulting solution was applied to a film substrate consisting of a polyester film having a thickness of 50 μm to form an adhesive layer having a thickness of 10 μm. Thus, a removable adhesive sheet was produced.

EVALUATION TESTS

The pressure-sensitive adhesive sheets obtained in the Examples and Comparative Examples were evaluated for adhesive strength and organic wafer fouling by the following methods. The results obtained are shown in Table 1.

(Adhesive Strength)

A tape piece cut out of each of the pressure-sensitive adhesive sheets produced in the Examples and Comparative Examples was applied to a stainless-steel plate whose surface had been finished with a #280 sandpaper. For this application, the adhesive tape was pressed against the plate by rolling a 2-kg roller forward and backward once on the tape. This sample was allowed to stand for 30 minutes and then examined for ordinary adhesive strength (N/10 mm width) in 180° peeling from the stainless-steel plate. The peeling rate was 300 mm/min.

(Organic Wafer Fouling)

A tape piece cut out of each of the pressure-sensitive adhesive sheets produced in the Examples and Comparative Examples was applied to a wafer coated with vapor-deposited aluminum. This sample was allowed to stand at 40° C. for 1 day. Thereafter, the tape piece was removed and the amount of the organic matter transferred to the wafer was measured with an ESCA (Model 5400, manufactured by Albackfai). Furthermore, a wafer which had not undergone the tape application was also analyzed in the same manner. The amount of the organic matter transferred (atomic %) was evaluated based on the increase in the amount of carbon atoms detected.

TABLE 1

| | Adhesive strength (N/10 mm) | Organic wafer fouling (atomic %) |
| --- | --- | --- |
| Example 1 | 6.18 | 2.5 |
| Comparative Example 1 | 5.20 | 18.7 |
| Example 2 | 1.77 | 14.05 |
| Comparative Example 2 | 0.98 | 24.94 |
| Example 3 | 2.10 | 4.80 |
| Example 4 | 1.21 | 10.3 |

Table 1 shows that the pressure-sensitive adhesive sheet obtained in each Example had a higher adhesive strength and was considerably reduced in organic wafer fouling as compared with the pressure-sensitive adhesive sheet obtained in the corresponding Comparative Example.

Since the removable pressure-sensitive adhesive sheet of the invention comprises a pressure-sensitive adhesive which comprises as the base polymer a high-molecular polymer reduced in the content of low-molecular components, the pressure-sensitive adhesive layer is excellent in not only cohesive force but adhesive strength. In addition, the removable pressure-sensitive adhesive sheet, when used for fixing adherends thereto in work processing or the like, has such a degree of moderate tackiness as not to peel off the adherends. After the work processing or the like, this pressure-sensitive adhesive sheet can be easily removed from the adherends without fouling them. In particular, the removable pressure-sensitive adhesive sheet, when used as, e.g., a radiation-curable pressure-sensitive adhesive sheet for semiconductor wafer processing, has high tackiness during processing such as grinding or dicing to facilitate the processing and, after the processing, can be made easily removable, through curing by irradiation with a radiation, without causing wafer breakage, etc. Furthermore, this pressure-sensitive adhesive sheet neither emits a strong odor upon curing nor leaves a fouling adhesive residue on the order of micron or submicron. Consequently, there is no possibility that the chip back side/encapsulating resin separation attributable to such fouling might occur.

What is claimed is:

1. A semiconductor wafer processing method, comprising adhering a removable pressure-sensitive adhesive sheet which comprises a pressure-sensitive adhesive layer which is made of at least a pressure-sensitive adhesive comprising a polymer in which the content of low-molecular components having a molecular weight of $10^5$ or lower is 10% by weight or lower, and the polymer has a weight average molecular weight of 930,000 to 2,100,000, to a front or back surface of the wafer, and processing the wafer.

* * * * *